United States Patent

Schlag et al.

[11] Patent Number: 6,110,245
[45] Date of Patent: Aug. 29, 2000

[54] FILTERING VENTILATOR OR OUTLET FILTER

[75] Inventors: Frank Schlag, Hamburg; Bernd Glashoff, Lasbek-Dorf, both of Germany

[73] Assignee: Otto Pfannenberg Elektro-Spezialgeratebau GmbH, Hamburg, Germany

[21] Appl. No.: 09/244,296

[22] Filed: Feb. 3, 1999

Related U.S. Application Data

[63] Continuation of application No. 08/943,032, Oct. 2, 1997, abandoned.

[30] Foreign Application Priority Data

Nov. 15, 1996 [DE] Germany .................. 296 19 902 U
Dec. 19, 1996 [DE] Germany .................. 296 22 091 U

[51] Int. Cl.[7] .................................................. B01D 50/00
[52] U.S. Cl. ........................... 55/385.6; 55/471; 55/502; 55/503; 55/507; 454/184
[58] Field of Search ........................ 55/385.6, 385.7, 55/385.4, 490, 495, 501, 505, 507, 509, 467, 471, 473, 502; 454/184

[56] References Cited

U.S. PATENT DOCUMENTS 3,250,063  5/1966  Andrews ..................................... 55/505
5,007,946  4/1991  Babini ........................................ 55/501
5,431,974  7/1995  Pierce ....................................... 55/385.4
5,769,916  6/1998  Immel ........................................ 55/495

FOREIGN PATENT DOCUMENTS 19525850  8/1996  Germany .

Primary Examiner—David A. Simmons
Assistant Examiner—Robert A. Hopkins
Attorney, Agent, or Firm—Friedrich Kueffner

[57] ABSTRACT

The filtering ventilator (100) to be installed into the wall of a switch cabinet, in which case the mounting wall (80) is provided with a cutout (81) for the filtering ventilator (100), in which the filtering ventilator is retained and secured, which is comprised of a frame-like basic housing (10) possessing a lattice bottom (10a), a filter mat (60) inserted into the covering housing (30) mounted upon the basic housing (10) and covering the filter mat (60) and a fan motor (71) secured on the basic housing, wherein the basic housing (10), on its circumference, is provided with a screwless rapid fastening device (50) for mounting the filtering ventilator (100) in the cutout (81) of the mounting wall (80), the filtering ventilator being installable so as to be RF-shielded, is provided with a metal insert (200) connected to the basic housing (10), which is comprised of a frame (201) with a lattice bottom (202) and which is connected with the aid of screwing, riveting or clamping means to the basic housing (10) (FIG. 1).

8 Claims, 15 Drawing Sheets

30

100

FILTERING VENTILATOR OR OUTLET FILTER

This is a continuation of application Ser. No. 08/943,032 filed Oct. 2, 1997, abandoned.

The invention relates to a filtering ventilator or an outlet filter for installation into the wall of a switch cabinet or suchlike, wherein the mounting wall for the filtering ventilator or the outlet filter is provided with a cutout, in which case the filtering ventilator or the outlet filter is retained and secured, wherein the filtering ventilator or the outlet filter is comprised of a frame-like basic housing with a latticed bottom, a filter mat fitted into the basic housing, a design frame or covering housing mounted onto the basic housing and covering the filter mat, wherein the basic housing, on its circumference, is provided with a screwless rapid fastening device for the mounting of the filtering ventilator or of the outlet filter in the cutout of the mounting wall. The filtering ventilator is provided with a fan motor secured to the basic housing. The filtering ventilator as well as the outlet filter can be mounted in an RF-shielded fashion.

In order to draw off the heat developing in the interiors of e.g. switch cabinets and the like housing electronic control equipment and switching gear, it is known to supply fresh air by means of a fan. The fan is in such a case retained in position in a recess or cutout formed in the cabinet wall with the aid of a screwed connection while, for the exhaustion of the air, air outlet slots for air outlet filters are provided at another point of the switch cabinet wall. The installation of such filter ventilators equipped with a fan in switch cabinet walls of this type often is laborious since, when screwed connections are employed, hardly any margin is available which would enable one to subsequently still align the filter ventilator optically. Moreover, it is not possible to bridge any substantial clamping ranges in order to make allowance for different sheet metal thicknesses of the mounting walls.

BACKGROUND OF THE INVENTION

From the DE-A-3 710 566, a switch cabinet with an air conditioning device is known, in which the covering wall of the cabinet body and the underside of the air conditioning unit are provided with reciprocally harmonized and aligned and interconnected openings. In this case, an intermediate panel with openings is rigidly connected with the covering wall of the cabinet body. The openings in the intermediate panel are harmonized and aligned with the openings in the covering wall of the cabinet body. The intermediate panel is provided with an upwardly bent rim on three sides. For the detachable connection of the air conditioning unit and the intermediate panel, on the outsides of the oppositely located rims of the interim panel and the outsides facing the same of the air conditioning unit intercalated into the intermediate panel, mutually harmonized locking elements are mounted, each comprising at least one rapid fastening device. The rapid fastening devices used in this case are in the form of manually operable lever locks.

The DE-A-3 532 169 describes a filter for the cooling air of electric equipment provided with a frame-like retaining part insertable from the outside into a wall section of the device as well as with a filter insert, wherein the retaining part possesses connecting elements that are unlockable from the outside for the detachable fixation of the filter in the wall cutout. As connecting element between the filter and the side wall of the device, on the one hand a drag bearing is provided on the underside of the retaining part as well as snap-in clips or brackets on the upper side of the side wall portions. The drag bearing is made up of the rim projecting on the underside and of the retaining projections behind the same via the wall cutout.

On the outside the snap-in clips or brackets each carry a snap-in projection which, in the closing position, engage behind the side wall at the wall cutout. The snap-in clips or brackets are located in a flange continuing in each case in one of the side wall portions, into which, from the front end, marginally open indentations are incorporated for the formation of approximately tongue-shaped snap-in clips and show a forwardly directed extension with a particularly manually operable push button. By means of a reciprocal application of pressure on the push button, the snap-in projections can be disengaged and, subsequently, the filter can be swung out around the drag bearing.

A mounting frame of elastically deformable high polymeric material for the detachable mounting of a substantially rigid accommodation housing containing a measuring instrument in the cutout of a wall with a frame wall disposed vertically to the wall which rests against the wall with fitting shoulders and whose cutout reaches through, while locking tongues of the frame wall project outwardly from the plane of the frame wall and are elastically depressable in the direction of this plane and are provided with sliding surfaces, which enclose an acute angle to the plane of the frame wall and, in the mounting position, engage behind the wall, becomes apparent from the DE-A-2 757 959. A mounting frame serves in this case a coupling element of the measuring device at the wall cutout, which corresponds approximately to the geometric configuration of the punched-out portion in the wall, e.g. of a switch cabinet. The frame wall carries locking tongues which project from the plane of the frame wall and which are elastically depressable in the direction of this plane; in addition, the locking tongues are provided with sliding surfaces. For the connection, the locking tongues engage lockingly in recesses in the wall of the accommodation housing. The attachment in the wall of the switch cabinet is then performed with the aid of further locking tongues. A spring-loaded catch constructed in this manner, in comparison with screwed connections, simplifies an attachment of a measuring instrument or device in a mounting frame because the measuring instrument is merely pressed into the mounting frame and, following this, the entire unit is caused to lockingly engage into the wall of the switch cabinet, however,an adaptation of this spring-loaded catch to differing sheet metal thicknesses of the mounting wall and an alignment and a centering following the effected installation is no longer possible.

In the documents "IBM Technical Disclosure Bulletin, Vol. 32 No. 3k, August 1989, Pages 342–343" and in the DE-U-87 07 975, merely spring-loaded catches for the mounting of axial fans are described.

The RF-shielded installation of a filtering ventilator into the cutout of a mounting panel is known from the DE 195 25 850. The filtering ventilator installed in an RF-shielded manner into the cutout of a mounting panel is comprised of an electrically conducting casing with an accommodation portion for a filter mat, wherein the accommodation portion projects through the mounting panel cutout and has a flange which, with the aid of an electrically conductive adhesive agent, is affixed around the cutout with the mounting panel, wherein, by the interposition of a wire grate, a ventilator is connected to the accommodation portion of the housing projecting from the cutout and the filter mat inserted into the accommodation portion of the housing is covered with the aid of a lamellar grate. In this filtering ventilator, the electrically conducting housing and the electrically conducting grate cover the cutout of the mounting plate in an RF-shielded fashion and the electrically conductive adhesive layer provided between the flange of the housing and the mounting panel seals the point of transition between the housing and the mounting panel in an RF-shielded manner so that an absolutely HF-shielded installation of the filtering ventilator is supposedly ensured. However, the RF-shielded mode of installation of this filtering ventilator does presuppose that the filtering ventilator is comprised of an electrically conducting housing and that, in addition, a wire grate is employed, while, with the aid of an electrically conductive layer of adhesive, the point of transition between the housing and the mounting panel is sealed so as to be RF-shielded. In lieu of an electrically conducting housing it is also possible to employ a housing comprised of a plastic material which is subsequently coated with an electrically conducting layer. A filtering ventilator constructed in this way is not recycelable since all the materials used, viz. plastic, metal, mat and the like cannot be individually separated, for a separation of the housing coated with an electrically conductive coating is possible only to a limited extent and at great expense.

The technical problem of the invention on file is to provide a filtering ventilator and an outlet filter according to the type described in the beginning, which can be mounted so as to be RF-shielded in the cutout of a mounting wall, wherein both the filtering ventilator as well as the outlet filter are recycelable in the form of an environmentally acceptable product in that all the materials used, such as plastic, metal, mat and suchlike, can be individually separated without that e.g. metallic parts call for separate steps from plastic parts connected with or integrated into the latter. Moreover, the filtering ventilator and the outlet filter are to be constructed in such a fashion that, apart from an RF-shielded installation into a mounting wall, also a rigid mounting in the cutouts provided in the mounting walls is possible.

SUMMARY OF THE INVENTION

According to the invention, a metal insert is mounted onto the frame-shaped basic housing of the filtering ventilator or of the outlet filter and detachably connected with the basic housing with the aid of a second connection or with some other suitable connecting means, in which by preference the metal insert is constructed in a housing-like configuration and, in the mounted state on the basic housing, with its circumferential wall, engages over the circumferential wall of the basic housing of the filtering ventilator or the outlet filter.

The metal insert itself is provided with a lattice bottom. Frame and latticed bottom of the metal insert are of one-piece construction and are comprised of an electrically conducting metallic material. The attachment of the metal insert to the basic housing of the filtering ventilator or of the outlet filter is effected with the aid of screwed connections, riveting or clamping means.

The RF-shielded filtering ventilator and the outlet filter can be mounted in a simple manner in the cutout of a mounting wall, to be more precise, with the aid of a rapid fastening device, whereby, with the aid of the metallic filter and by the employment of EMV sealing, a high degree of noise immunity and a low noise emission in various dimensions is ensured.

The filtering ventilator and the outlet filter in question are, by virtue of this construction according to the invention, environmentally acceptable, i.e. recycelable products in conformity with ISO 14000. All the materials of which the filtering ventilator and the outlet filter are comprised, such as plastic, metal, mat and the like, can be individually separated and thus individually disposed. To this is added the circumstance that a retrofitting of already installed filtering ventilators and outlet filters with the metal insert is possible. The RF shielding is optimal and almost complete within the range of up to 300 MHz; within the range of up to 1 GHz, it is true, the attenuation is 5 through 10 dB (m) below the optimum.

The mounting of the filtering ventilator or of the outlet filter is simple. The basic frame is connected to the metal insert by means of rivets, screws or the like.

After this, an EMV sealing tape is applied to this assembly. In the process, attention will have to be paid that this tape application is performed all around in an overlapping fashion. Depending on the type of construction, the ventilator motor is integrated when the metal insert is attached. Filter mat and design frame or covering housing ensure the dustproof and moistureproof sealing of the equipment. Prior to the mounting in the switch cabinet cutout or in a mounting panel, attention will have to be paid to the circumstance that surfaces which, due to a treatment, are not electrically conducting, are put into a metallically blank state by means of tools within the contact area of the EMV sealing tape.

The protection comprises all metallic inserts which are replaced with grates, expanded metal or other sheet metal parts; likewise all electrically conductive material variants, e.g. electrically conductive plastics. Likewise all mounting types, such as mounting without any further fastening elements, such as e.g. snap-action mechanisms on the basic frame in any form and position whatsoever, as well as the mounting with fastening elements, such as screws, metal springs and suchlike, are included.

The metal insert mounted upon the basic housing and connected to the same is comprised of a frame-like housing, whose bottom is constructed in a grate-like or lattice-like fashion and whose side walls engaging over the basic housing possess outwardly angled wall sections, which are supported upon the circumferential rim of the design frame or of the covering housing, said rim projecting laterally in relation to the basic housing, in which case the outwardly angled circumferential wall sections of the metal insert form a continuous circumferential surface area. This embodiment will always be employed when the basic housing does not possess any rapid fastening means in its corner areas.

If the rapid fastening device is constructed on the basic housing within the corner areas of the latter, in that case the side walls of the metal insert, within the region of the rapid fastening device, will possess recesses, in which case, onto the remaining angled wall sections of the side walls of the metal insert, an EMV sealing tape of an electrically conducting material is applied, whose four sections overlap within the corner regions of the design frame or the covering housing so that a continuous circumferential electrically conduct-surface area is provided.

By preference, the EMV sealing tape is bonded onto the angled wall sections of the metal insert and onto the surfaces located in the area of the rapid fastening device of the circumferential frame of the design frame or of the covering housing.

The EMV sealing tape is preferably comprised of a metal strip possessing a plurality of parallel indentations proceeding parallelly and equidistantly relative to each other which extend approximately over half the width of the metal tape, while each tongue-shaped section formed between two indentations possesses a section angled aside from the section surface with a basic surface area proceeding diagonally to the area of the section, while on the indentation-free section of the metal tape, a self-adhesive coating is applied which is located at the side of the angled section of the tongue-shaped sections and which, when in the non-used state, is covered with a peelable protective sheet.

BRIEF DESCRIPTION OF THE DRAWING

Embodiment examples of the invention are explained in greater detail with the aid of the drawing. Thus

DETAILED DESCRIPTION OF THE PREFERRED EMBODIMENT

Figure 1:
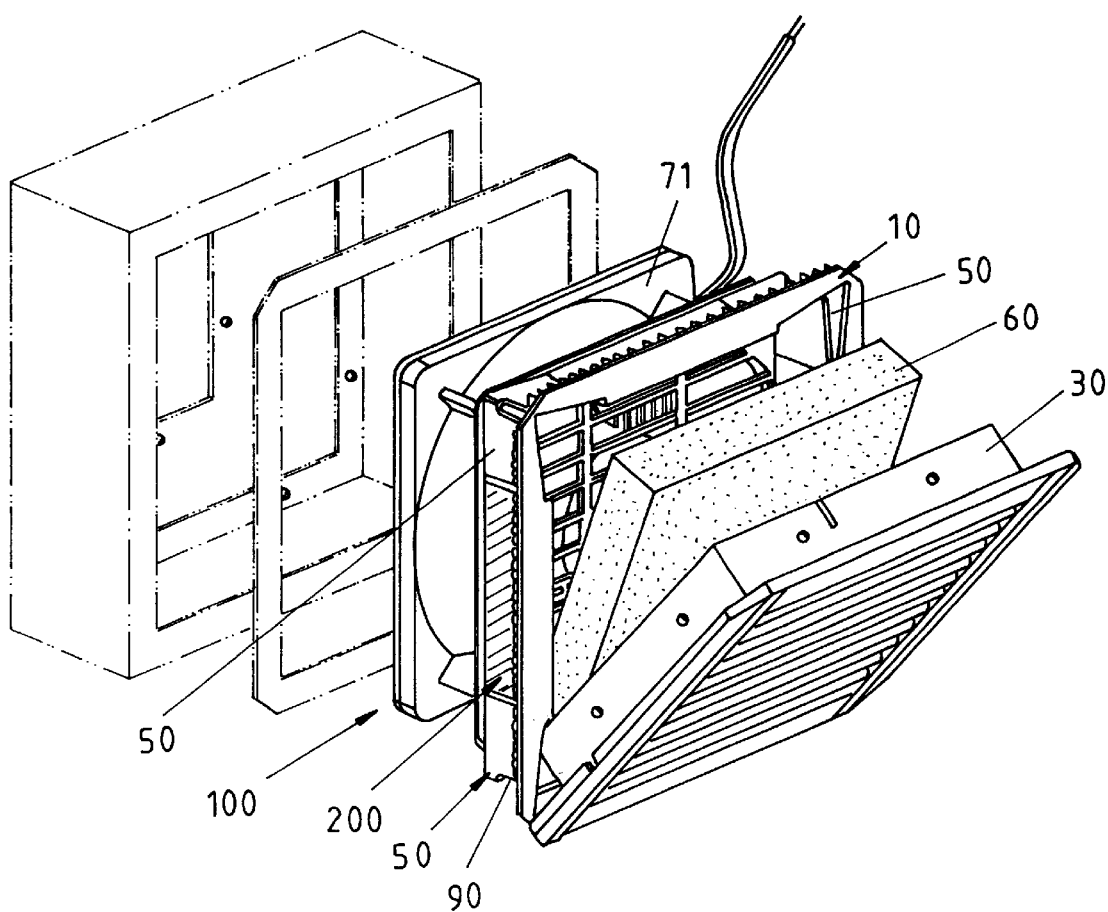
FIG. 1 shows in an exploded view the filtering ventilator comprised of the basic housing, the covering housing, the fan support and the metal insert.
Figure 1A:
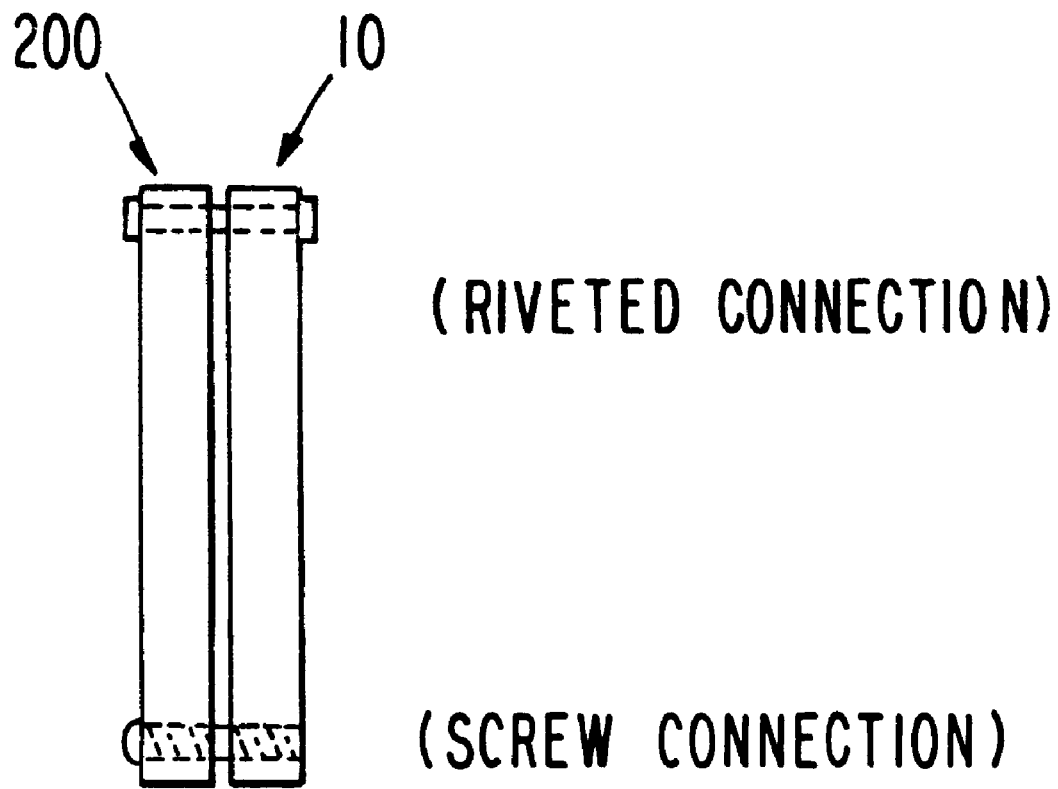
FIG. 1a shows a rear view of FIG. 1 of how the insert formed form electrically conductive material is attached to the basic housing.
Figure 2:
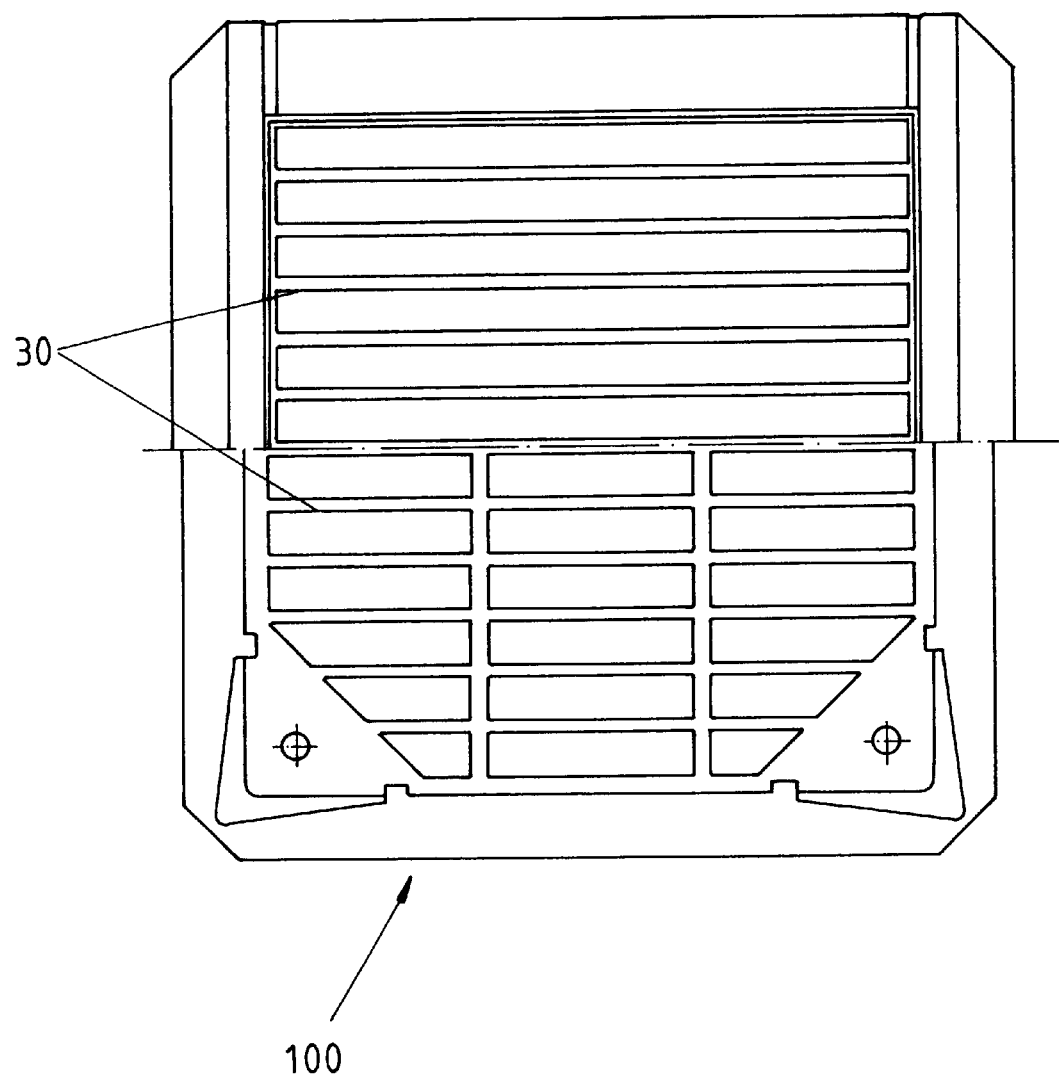
FIG. 2 shows a front view of the filtering ventilator.

The filtering ventilator 100 illustrated in the FIGS. 1 through 4 is comprised of a frame-like basic housing 10 with a latticed bottom, a filter mat 60 inserted into the basic housing 10, a design frame or covering housing 30 mounted on the basic housing 10 and covering the filter mat 60 and a fan motor 71 secured to the basic housing 10, in which the basic housing 10, on its circumference, is provided with a screwless rapid fastening device 50 for the mounting of the filtering ventilator 100 in the cutout 81 of a mounting wall 80. The design frame or covering housing 30 is lamellarly or grate-like in its construction while a pertinent number of passages and perforations are formed therein, in which case also other decorative constructions for the front end of the design frame or the covering housing 30 can be employed. Connected with the basic housing 10 of the filtering ventilator 100 is a metal insert 200, which is mounted on the side facing away from the filter mat 60 onto the basic housing 10.

This metal insert of electrically conducting material is comprised of a frame 201 with a latticed bottom 202. The attachment of the metal insert 200 on the basic housing 10 is effected with screwed, riveted or clamped means, it is possible, however, for otherwise constructed connecting means to be made use of here.

For the rapid mounting of the filtering ventilator 100 in the cutout 81 of a mounting wall 80, which may e.g. be formed of the wall of a switch cabinet, the basic housing 10 is provided with a rapid fastening device 50 which, by preference and as described in greater detail hereinafter, is disposed in the four corner regions of the basic housing and constructed on the same, while the possibility also exists of employing otherwise constructed fastening devices, which are also provided and constructed in other areas of the basic housing 10 on the same.

Figure 6:
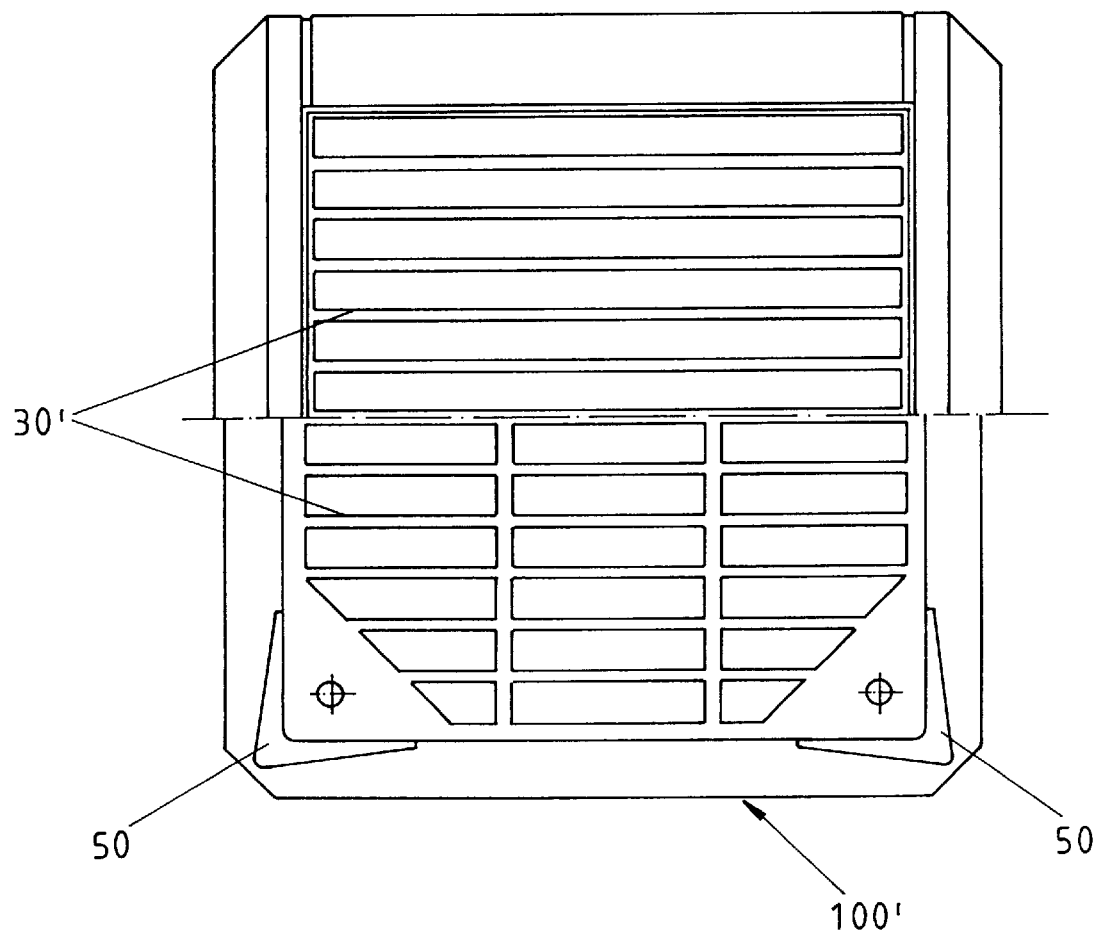
FIG. 6 shows a front view of the outlet filter.
Figure 7:
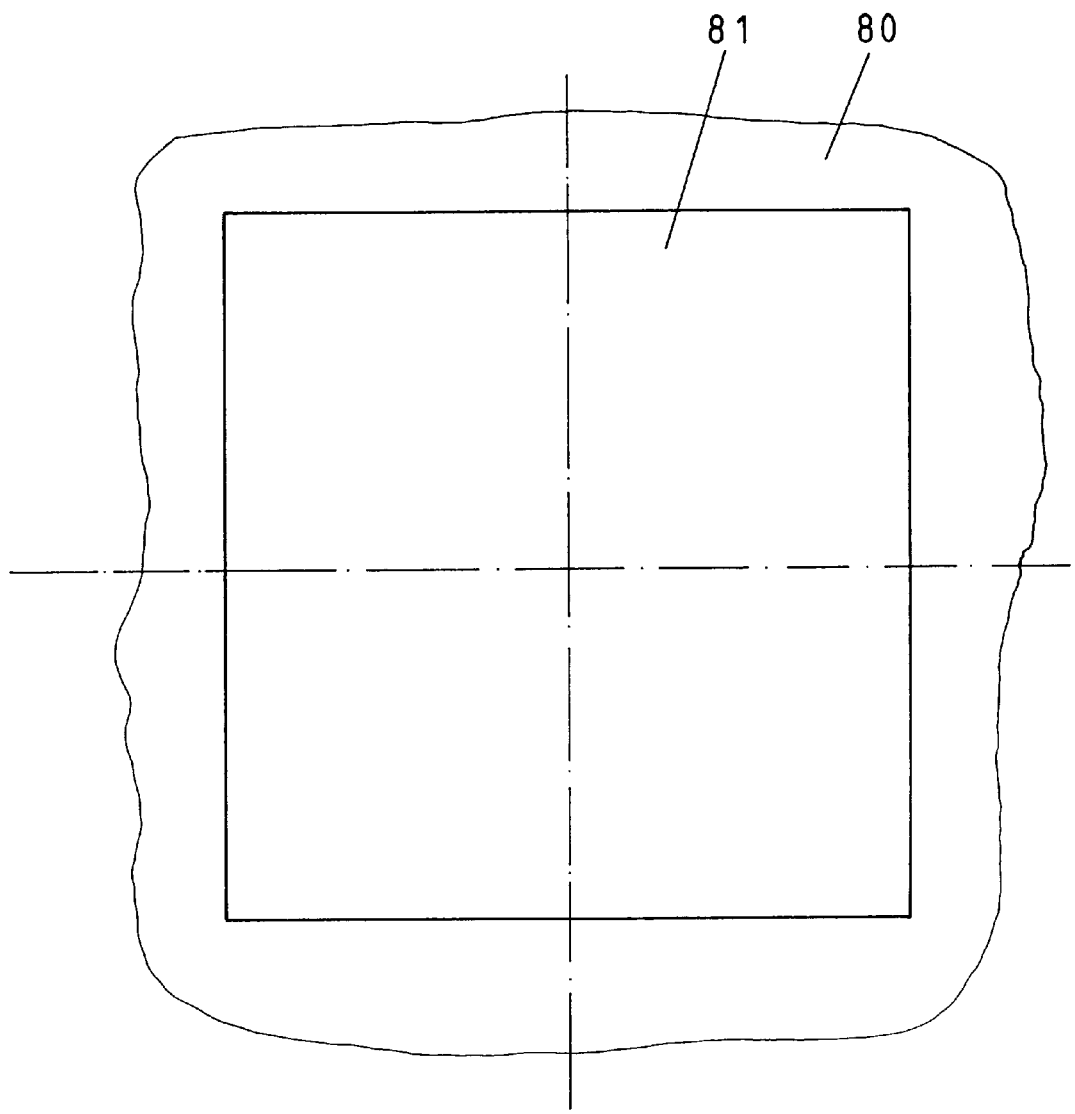
FIG. 7 shows a view onto the mounting wall with a cutout for the reception and the mounting of the outlet filter.

A similar construction as the one of the filtering ventilator 100 possesses also the outlet filter 100' with the exception of the fan motor 71 in the filtering ventilator 100 (FIGS. 6 through 7).

The outlet filter 100' is, just like the filtering ventilator 100, provided for being installed into the wall of a switch cabinet or suchlike, in which case the mounting wall 80 for the outlet filter 100' is provided with an appropriately dimensioned cutout 81, in which the outlet filter 100' is retained and mounted. The outlet filter 100' is comprised of a frame-shaped housing 10' with a latticed bottom 10'a, a filter mat 60' inserted into the basic housing 10' and of a design frame or covering housing 30' fitted onto the basic housing 10' and covering the filter mat 60', while the basic housing 10', on its circumference, is provided with a screwless rapid fastening device 50 for the mounting of the outlet filter 100' in the cutout 31 in the mounting wall 80. In lieu of a screwless rapid fastening device 50 on the basic housing 10', it is also possible to employ other fastening means for the mounting of the outlet filter 100' in the cutout 81 in the mounting wall 80.

The outlet filter 100' is provided with a metal insert 200 connected to its basic housing 10', which is constructed in the same way as is the metal insert in the filtering ventilator 100. This metal insert 200 is likewise comprised of a frame 201 with a latticed bottom 202. The attachment of the metal insert 200 to the basic housing 10' is effected with the aid of a screwing, riveting or clamping means. The metal insert 200 is comprised of an electrically conductive metal, whereas all other parts of the outlet filter 100', with the exception of the filter mat 60', are comprised of plastics. In the same way also the basic housing 10 and the designer frame or covering housing 30 of the filtering ventilator 100 are comprised of plastics. The housing which carries and accommodates the fan motor in the filtering ventilator 100 is likewise fabricated from plastic mate rials.

Figure 8:
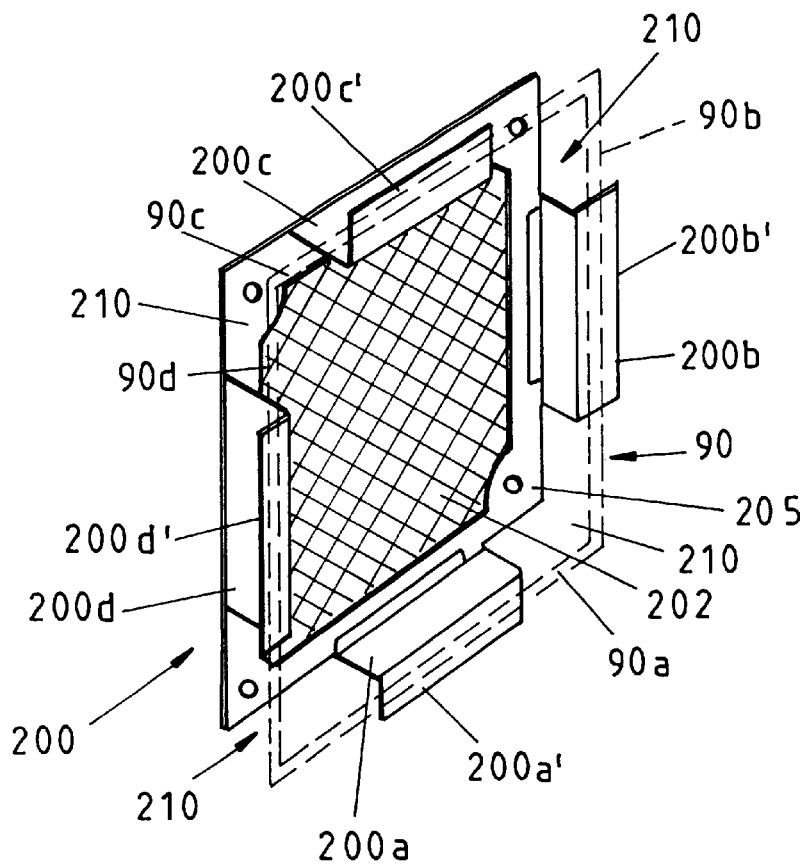
FIG. 8 shows a diagrammatical view of the metal insert for the filtering ventilator or the outlet filter.

The metal insert 200 employed both in the filtering ventilator 100 as well as in the outlet filter 100' is, as per FIG. 8, comprised of a frame-like housing 205, whose bottom 202 is constructed in a grate-like fashion. The side walls 200a, 200b, 200c, 200d of the metal insert 200 circumferentially delimiting the bottom 202 extend in an embodiment not depicted in the drawing, over the entire circumference of the bottom 202, in which case all four side walls 200a, 200b, 200c, 200d are interconnected within the corner areas. The height of the side walls 200a, 200b, 200c, 200d corresponds approximately to the height of the basic housing 10 or 10' of the filtering ventilator 100 or of that of the outlet filter 100' so that, when the metal insert 200 is fitted onto the basic housing 10,10', the side walls 200a, 200b, 200c, 200d of the metal insert 200 engage over the side walls of the basic housing 10, 10'.

Figure 3:
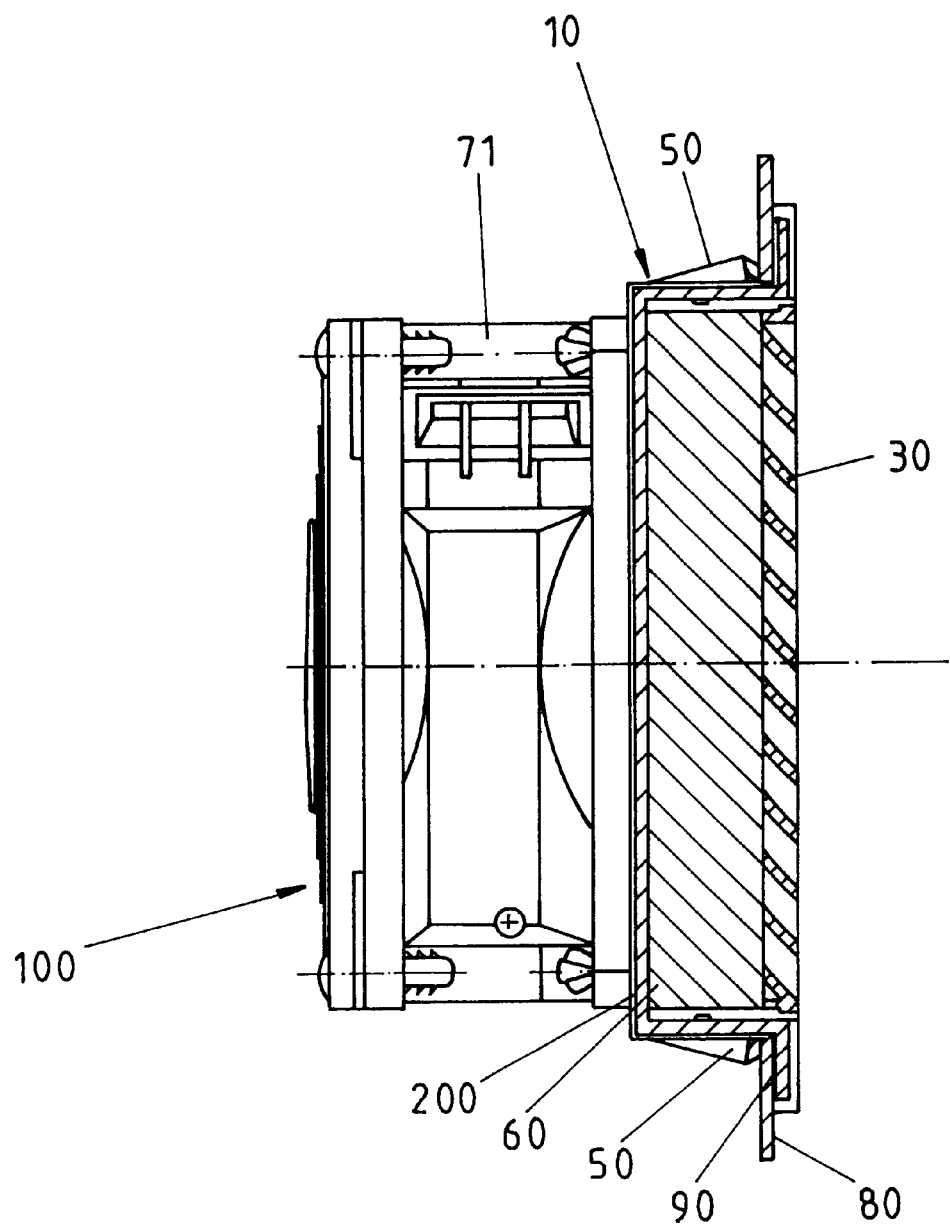
FIG. 3 shows the filtering ventilator in a side view and, in part, in a vertical section.
Figure 4:
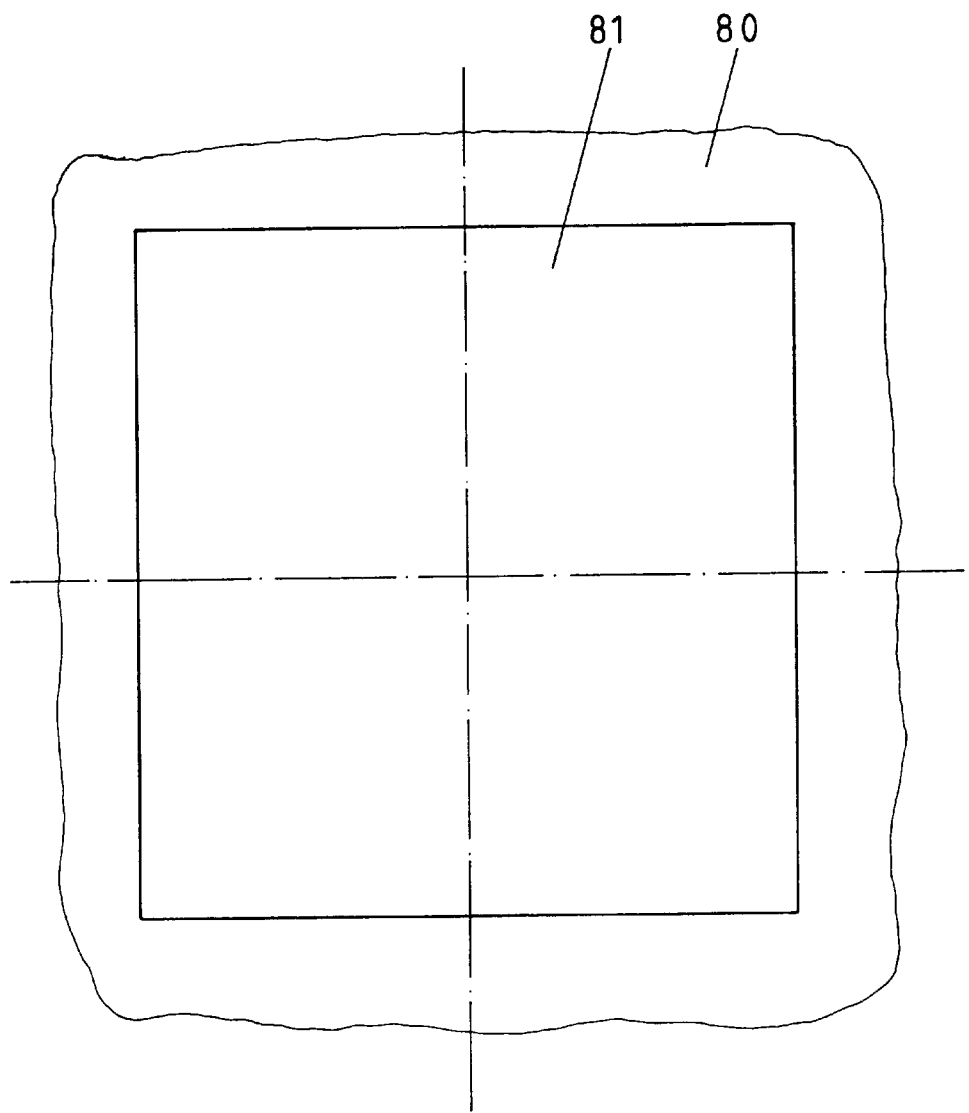
FIG. 4 shows a view onto the mounting wall with a cutout for receiving and inserting the filtering ventilator.
Figure 5:
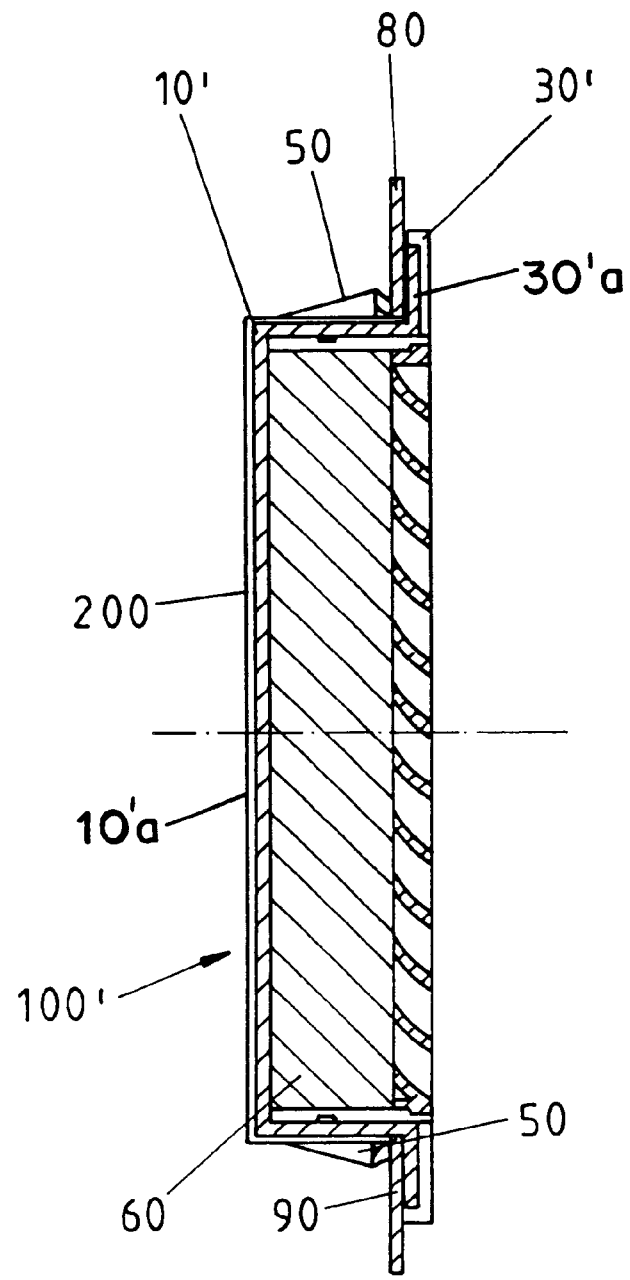
FIG. 5 shows an outlet filter comprised of the basic housing, the covering housing and the metal insert in a side view and, in part, in a vertical section.

The side walls 200a, 200b, 200c, 200d of the metal insert 200 engaging over the basic housing 10,10' possess outwardly angled wall sections 200a', 200b', 200c', 200d'(FIG. 8), which are supported upon the circumferential and, relative to the basic housing 10,10', laterally projecting rim 30a,30a' of the design frame or covering housing 30,30' (FIGS. 3 or 5). The outwardly angled circumferential wall sections 200a', 200b', 200c', 200d' of the four side walls 200a, 200b, 200c, 200d of the metal insert 200 consequently form a continuous circumferential electrically conductive surface area, in which case, over and above that, an EMV-tight tape 90 can be bonded onto this surface so that an RF shielded installation of the filtering ventilator 100 or of the outlet filter 100' is possible.

The construction used in the embodiment described in the foregoing presupposes that, within the corner regions of the basic housing 10, 10', no provision has been made for any rapid fastening devices 50 since this disposition and construction of rapid fastening devices on the basic housing 10, 10' call for a different construction of the metal insert 200. In the embodiment described in the foregoing, other types of mounting fastening elements are employed.

If the basic housing 10, 10' of the filtering ventilator 100 or of the outlet filter 100' possesses rapid fastening devices 50 in the corner areas, in that case the side walls 200a, 200b, 200c, 200d of the metal insert 200 possess, in the region of the rapid fastening device 50, recesses 210 (FIG. 8). Onto the remaining and angledly constructed wall sections 200a', 200b', 200c', 200d' of the side walls 200a, 200b, 200c, 200d of the metal insert 200, and EMV shielding tape 90 of an electrically conducting material is then applied, whose four sections 90a, 90b, 90c, 90d overlap in the corner areas of the design frame or of the covering housing 30, 30' so that a continuous circumferential, electrically conductive area is obtained, which is indicated in FIG. 8 with 90a, 90b, 90c, 90d.

In order to obtain a high degree of HF shielding, the EMV shielding tape 90 is bonded onto the angled wall sections 200a', 200b', 200c', 200d' of the metal insert 200 and onto the areas of the circumferential rim of the design frame or covering housing 30, 31, which are located within the region of the rapid fastening device 50 on the basic housing 10, 10'.

Figure 9:
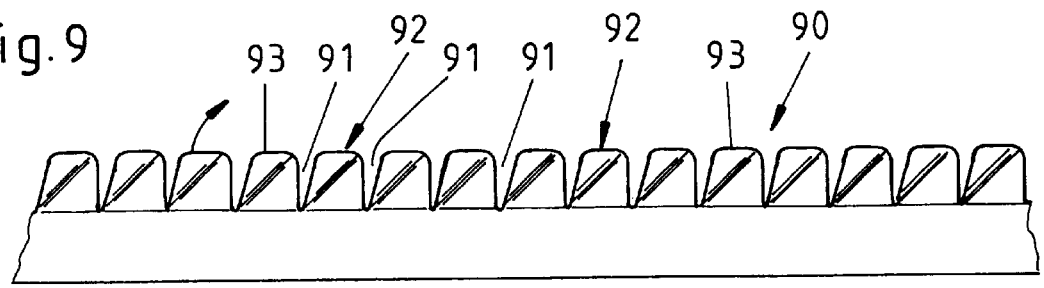
FIG. 9 shows a diagrammatical view of a section of the EMV sealing tape.
Figure 17:
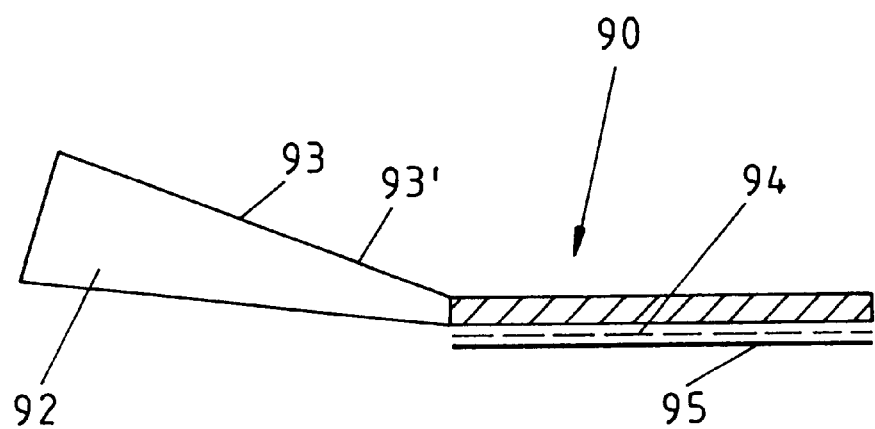

According to the FIGS. 9 and 17, the EMV shielding tape 90 is comprised of a metal strip of an electrically conducting material provided with a plurality of parallelly and equidistantly proceeding indentations 91 extending approximately over half the width of the metal tape, in which case each tongue-like section 92 formed between two indentations 91, possesses a section 92 angled away from the section surface area with a basic area proceeding diagonally to the area of the section 92. Onto the indentation-free section of the metal band of the EMV shielding tape 90, a self-adhesive coating is applied, which is located on the side of the angled section 93 of the tongue-shaped section 92. In the state of non-use of the EMV shielding tape, the self-adhesive coating 94 is covered with a peeling protective sheet 95 (FIG. 17).

Instead of an EMV shielding tape 90 of an electrically conductive metal it is also possible to employ sealing tapes which are comprised of electrically conducting plastics, in which case it is also possible to use plastic tapes provided with an electrically conducting coating. Also foamed plastics provided on one side with an electrically conductive coating can be made use of as EMV shielding tapes.

The filtering ventilator illustrated in the FIGS. 10, 11, 13 and 14 designated with 100 is, according to a preferred embodiment comprised of a basic housing 10 with a rapid fastening device 50 for securing the filtering ventilator 100 in the cutout or in a perforation 81, a mounting wall, a covering housing 30 clampingly retained on the basic housing 10, a filter mat 60 disposed in the covering housing and a fan support 70 with a fan 71, which may also be accommodated in a casing 72. The metal insert 200 is fitted onto the basic housing 10 and connected to the same. The covering housing 30 can also be constructed in the form of a design frame.

Figure 11:
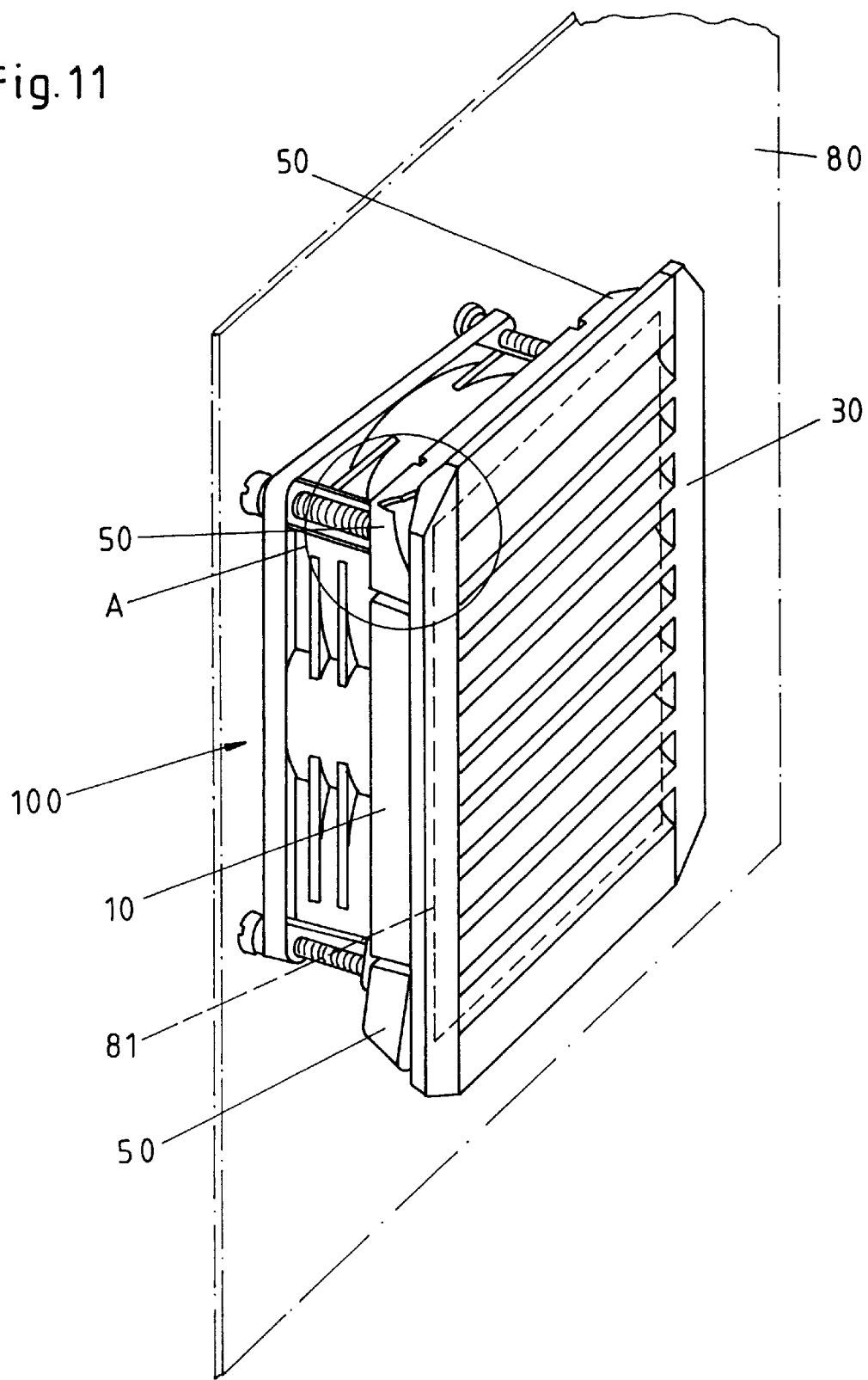
FIG. 11 shows in a diagrammatical view the filtering ventilator secured to a mounting wall in a variant form.

The basic housing 10 possessing a square or some other geometric configuration is formed of a frame 11 with four side walls 12, 13, 14, 15. The terminal regions 12 through 15 are identified with 12a and 12b, 13a and 13b, 14a and 14b and 15a and 15b (FIG. 11).

Figure 13:
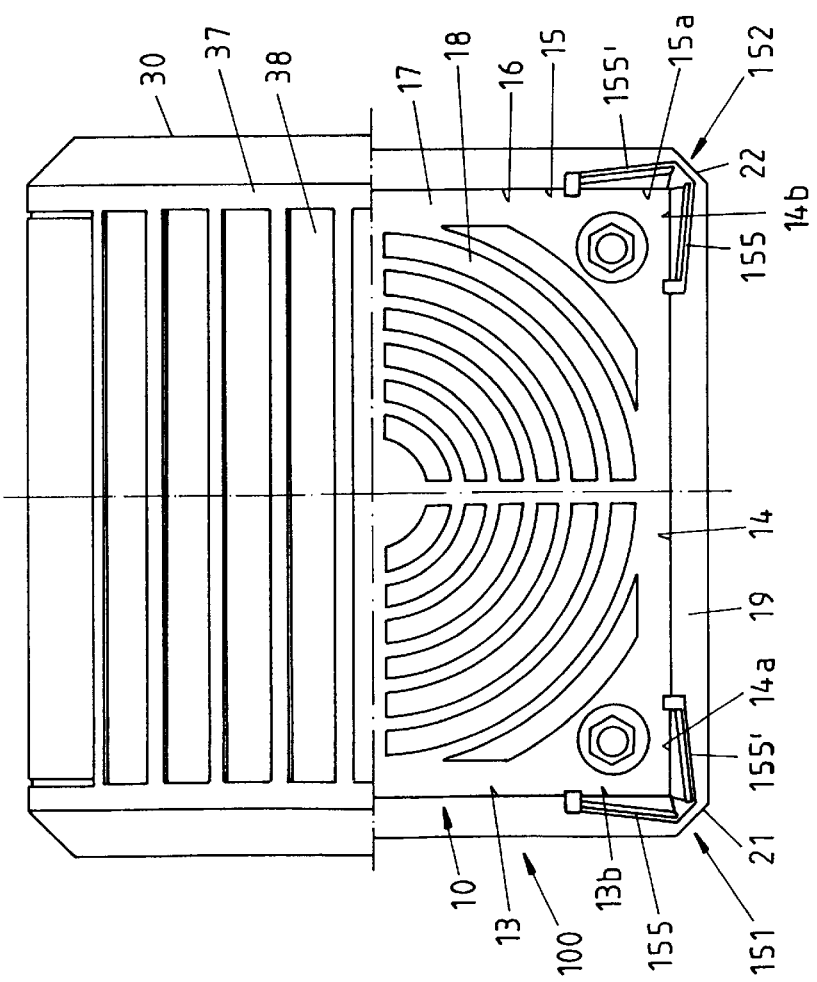
FIG. 13 shows a front view of the filtering ventilator with partly removed covering housing.

The frame opening 16 formed by the frame 11 of the basic housing 10 is closed with the aid of a plate-like blank 17, which is constructed in the form of a protective grate against accidental contact 18 (FIG. 13).

The construction and configuration of the protective grate against accidental contact 18 can be selected in any way whatever; what is essential is that an adequate number of perforations is available for an air conduction and air guidance. The frame 11 with the plate-like blank 17 is preferably constituted by a special element. The fixation of the plate-like blank 17 on the side walls 11 through 15 of the frame 11 is preferably effected within the central area of the side walls 12 through 15, while leaving open and constructing wing corners 151,152,153, 154 within the corner areas 21, 22, 23, 24 of the frame 11, this will yet be dealt with in greater detail hereinafter.

The plate-like blank 17 is extended so as to reach over the side walls 12 through 15 of the frame 11 while forming a circumferential section 17a. This circumferential section 17a forms the bearing edge or bearing rim 19 within the area of the cutout 81 of the mounting wall 80. This circumferential marginal section 17a may also be formed as a separate stop frame onto the side walls 12 through 15 and constitute a non-integrated component of the plate-like blank 17. The frame 11 with the side walls 12 through 15 and the plate-shaped blank 17 with the protective grate against accidental contact 18 as well as with the mounting wall bearing edge 19 forms a one-piece component part which e.g. is fabricated in the injection-molding process.

Figure 10:
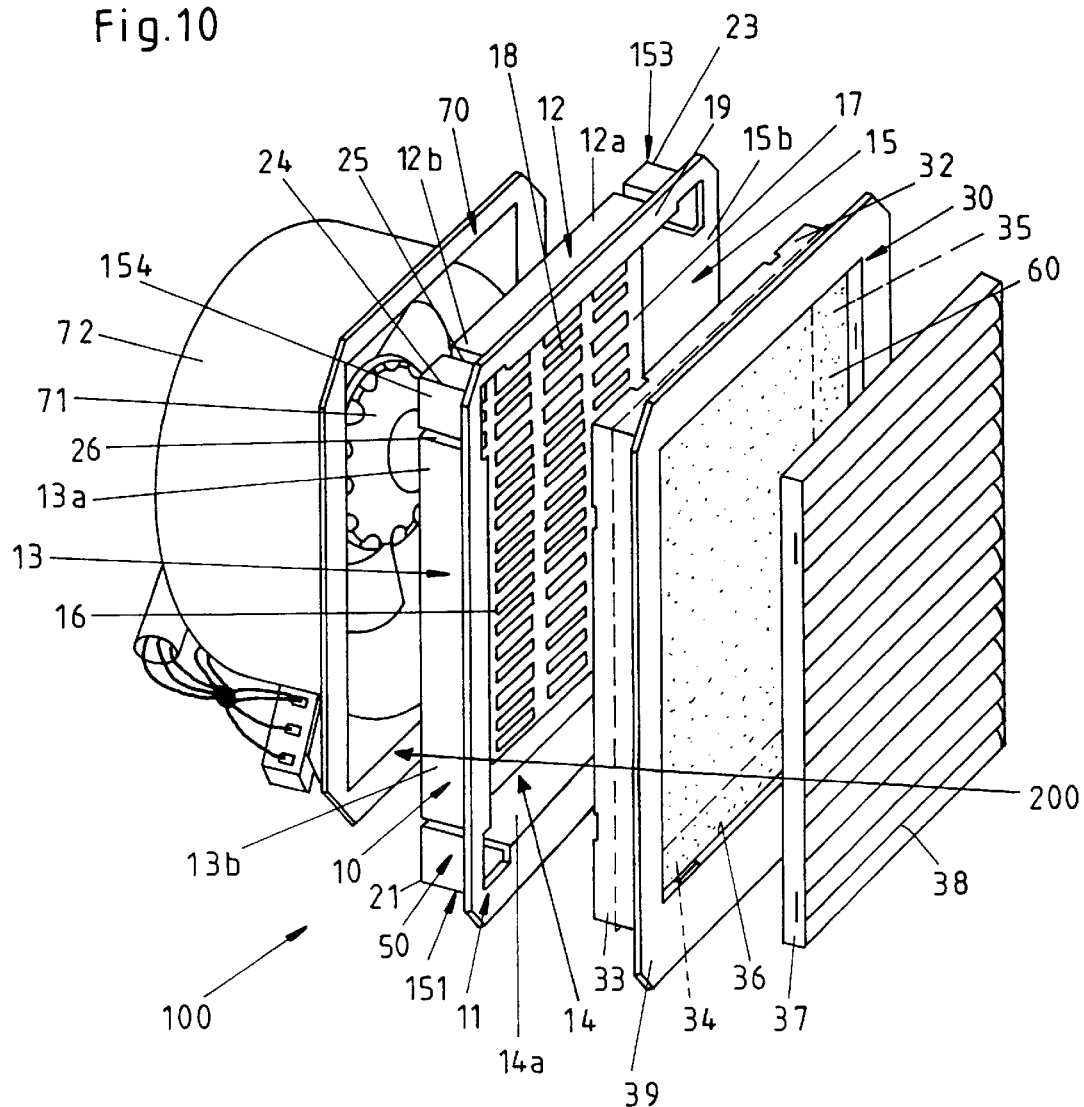
FIG. 10 shows in an exploded view the filtering ventilator with the rapid fastening devices constructed in the terminal regions of the basic housing.
Figure 14:
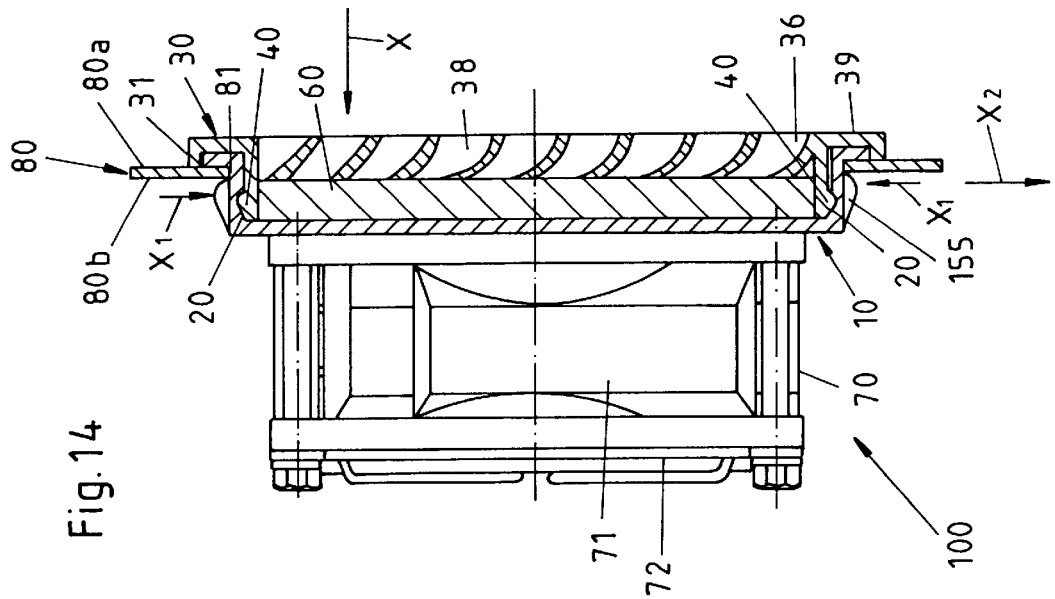
FIG. 14 shows a side view of the filtering ventilator with vertically sectioned basic housing and covering housing.

The covering housing 30 retained by press fit on the basic housing 10 is comprised of a frame 31 with the side walls 32, 33, 34, 35, in which case this frame 31, in its configuration and dimensions, corresponds to those of the frame 11 of the basic housing 10 (FIGS. 10, 11 and 14). The dimensions of the frame are in this case maintained in such a way that the covering housing 30, with its frame 31, can be introduced into the interior formed by the frame 11 of the basic housing 10. The side walls 32 through 35, when the covering housing 30 is inserted into the basic housing 10, rest against the inner wall areas of the side walls 12 through 15 of the frame 11 of the basic housing 10.

The opening formed by the frame 31 of the covering housing 30 is covered with the aid of a covering plate 37, which is a permanent element of the frame 31, but which can also be an independent component part, which in that case is retained by press fit or by some other suitable fastening elements in or on the frame 31 of the covering housing 31. The covering plate 37 is provided with a multiplicity of air guiding slots 38 or with otherwise configured perforations for an air conduction and air guidance. The construction of the air conduct ion slots 38 in the covering plate 37 is preferably effected by means of a foldable construction in the manner of a Venetian blind of the covering plate 37 with fixed or also adjustable flaps, in which connection the latter embodiment is particularly advantageous if filtering ventilators 100 are involved which possess larger dimensions. Over and above that the possibility also exists of providing the covering plate 37 with differently constructed perforations for an air conduction or air guidance since, after an effected installation of the filtering ventilation 100, the covering plate 37 of the covering housing 30 mounted onto the basic housing 10 forms a visible surface, it is possible for the covering plate 37 being provided with a specially constructed design by the construction of air guiding slots or air guiding perforations.

The frame 31 of the covering housing 30 is provided with an extended section disposed vertically to the frame side walls 32 through 35, which forms a circumferential bearing edge 39, against which the external wall area of the circumferential section 17a of the frame 11 rests when the covering housing 30 with its frame 31 is inserted into the frame 11 of the basic housing 10. The constructed circumferential bearing edge 39 of the frame 31 of the covering housing 30 can be formed onto the side walls 32 through 35 of the frame 31; however, the possibility also exists of providing this circumferential wall section forming the bearing edge 39 ny means of a pertinently dimensioned covering plate 37, whose dimension in this case will be larger than the external dimensions of the frame 31. The circumferential rim of this extended section forming the bearing edge 39 can, over and above that, be additionally bent aside in the direction of the frame 31 in order to engage over the circumferential rim of the section 17a of the frame 11 of the basic housing 10 when the basic housing 10 is connected with the covering housing 30.

The mounting of the covering housing 30 upon the basic housing 10 is performed with the aid of a clamping connection which is formed of pins 40 constructed on the external wall areas of the side wall 32 through 35 of the frame 31 of the covering housing 30 and pertinently disposed and configured recesses 20 on the internal wall areas of the side walls 12 through 15 of the frame 11 of the basic housing 10 so that, when the frame 31 of the covering housing 30 is introduced into the frame 11 of the basic housing 10, the pins 40 on the frame 31 engage into the appropriately profiled recesses 20 in the frame 11 of the basic housing 10 (FIG. 14).

The frame 31 of the covering housing 30 is dimension in such a way that the same is capable of accommodating a filter mat 60 constructed in a manner known per se, which, on the one hand, rests against the internal wall area of the covering plate 37 and, on the other hand, in the internal wall area of the protective grate against accidental contact 18 of the frame 11 of the basic housing 10 when the basic housing 10 is connected with the covering housing 30.

Figure 15:
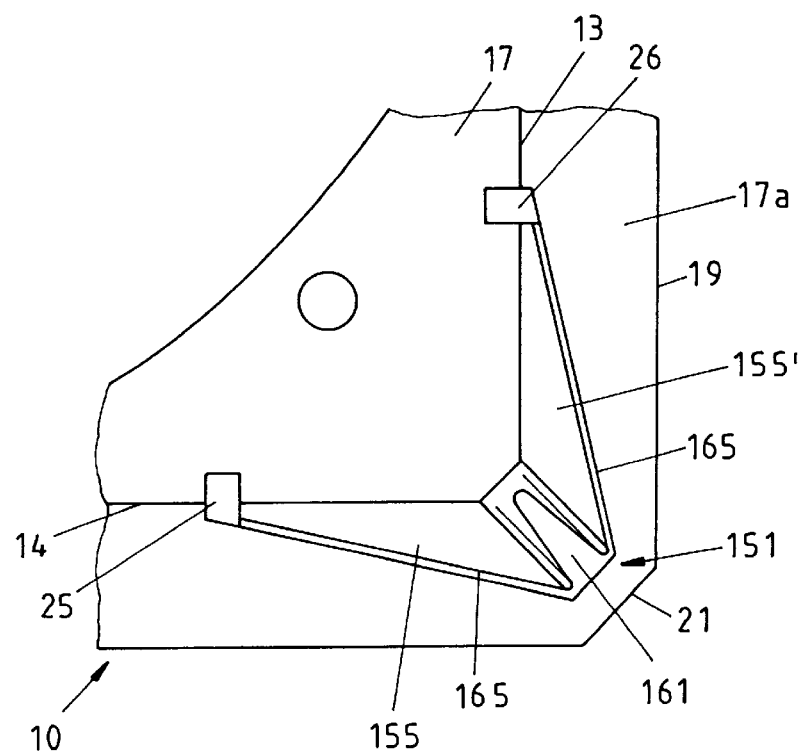
FIG. 15 shows an external view onto a wing corner of the rapid fastening device on the basic housing of the filtering ventilator.
Figure 16:
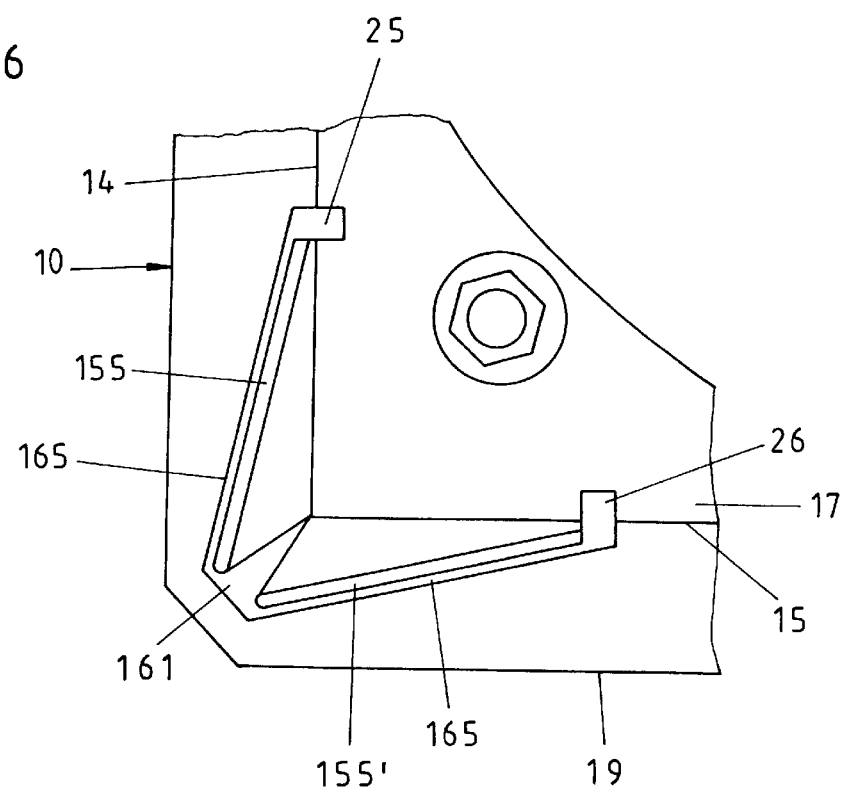
FIG. 16 shows an internal view onto a wing corner of the rapid fastening device in the frame of the basic housing of the filtering ventilator and FIG. 17 shows an enlarged vertical section through the EMV sealing tape.

The rapid fastening device 50 provided on the basic housing 10 for the filtering ventilator 100 is comprised of springably elastic wing corners 151, 152, 153, 154 constructed in the four corner areas 21,22,23,24 of the frame 11 of the basic housing 10. Each wing corner 151, 152, 153, 154 is formed of the frame side walls 12, 13 and 13, 14 and 14, 15 and 15, 12 adjacent in the corner areas 21, 22, 23, 24 and extended, springably elastic, wing-like clamping sections 155, 155' proceeding in the outward direction. The wing corners 151 through 154 within the corner areas 21 through 24 of the frame 11 are all of identical construction. The wing-like clamping sections 155, 155' of the four wing sections 151 through 154 also possess the same construction (FIGS. 12, 15 and 16).

The wing-like clamping sections 155, 155' of each wing corner 151 through 154 are dimensioned in such a way that, between their upper edges 160 and the wall area 17a forming the circumferential mounting wall bearing edge 19, an interspace 165 is formed.

Figure 12:
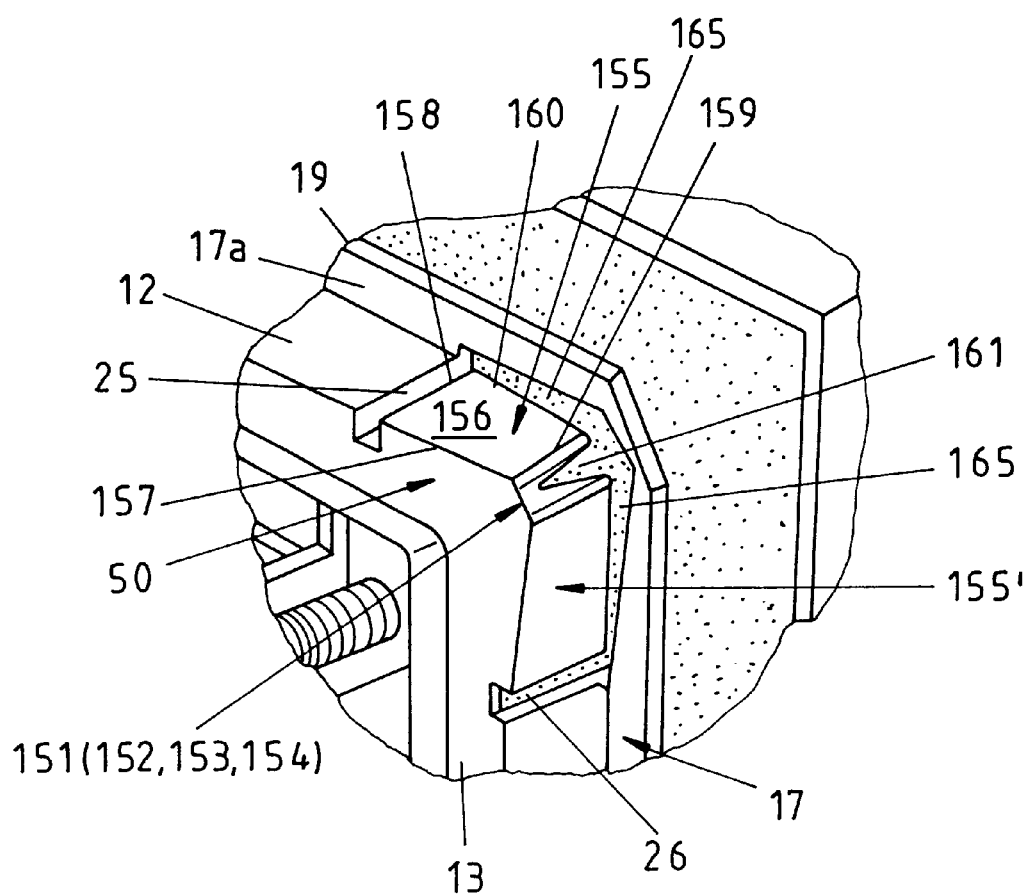
FIG. 12 shows in an enlarged diagrammatical view the corner area A of the filtering ventilator as per FIG. 11.

The wing-like clamping sections 155, 155' of each wing corner 151 through 154 are constructed in the terminal regions 12a, 12b and 13a, 13b and 14a, 14b and 15a, 15b of the side walls 12 through 15 of the frame 11 so that each side wall 12 through 15 comes to carry two wing-like clamping sections 155 and 155' on its terminal areas, in which case these clamping sections 155, 155' are not themselves in connection with the side walls 12 to 15, but are formed onto the blank 17 of the frame 112 (FIG. 12).

Since the two wing-like clamping sections 155, 155' are of identical construction, the wing-like clamping section 155 is described in greater detail in the following. This wing-like clamping section 155 is comprised of a rectangular, plate-shaped blank 156 with a basic edge 157 connected with the basic housing blank 17, two side edges 158, 159 vertically disposed on this basic edge 157 and of an upper side edge 160. In this case, the side edge 158 is disposed at approximately a right angle to the basic edge 157, whereas the side edge 159 extends slightly in the outward direction (FIG. 12), it being also possible in this case for the two wing-like clamping sections 155, 155' to be interconnected. In addition, the side edge 159, in comparison with the other side edge 159 of the plate-like blank 156, possesses a smaller length so that the upper side edge 160 proceeds obliquely relative to the basic edge 157.

The two thusly constructed wing-like clamping sections 155, 155' are, within the corner areas 21 through 24 of the frame 11, while located at approximately a right angle to each other, disposed in such a way that their side edges 159 are located opposite each other while leaving a minor clearance 161 free. Over and above that, each wing-like clamping section 155 or 155' is dimensioned in such a manner that, between its upper side edge 160 and the circumferential section 17a with the mounting wall bearing edge 19, an interspace 165 is formed which corresponds approximately to the material thickness of the mounting wall 80. Both wing-like clamping sections 155, 155' are separated from the side walls 12 through 15 of the frame 11 of the basic housing 10 by means of indentations 25, 26 proceeding transversely to the longitudinal direction of the side walls 12 through 15 so that the wing corners 151 through 154 are produced and from a by itself springably elastic element with the wing-like clamping sections 155, 155'. This interspace 165 expands conically in the direction of the side edge 159 of the wing-like clamping section so that, within the region of the side edge 158, the interspace 165 possesses a lesser width compared with the width of the interspace within the area of the side edge 159. It is hereby possible to achieve a clamping mounting on the mounting wall even when the mounting wall possesses differing sheet metal thicknesses.

On account of the extension of the wing-like clamping sections 155, 155' from the plane formed by the side walls 12 through 15 of the frame 11, the outer surfaces of the plate-shaped blank 156 of the wing-like clamping sections 155, 155' form sliding surfaces, whereby the insertion of the basic housing 10 into the cutout 81 in the mounting wall 80 is facilitated (FIG. 14). The extension of the wing-like clamping sections 155, 155' takes place in the direction toward that area within which two wing-like clamping sections 155, 155' of each wing corner 151 through 154 are in contact so that the extension of the wing-like clamping sections in the direction of the corner areas in the upper regions of the clamping sections takes place.

The basic housing 10 and the covering housing 30 of the filtering ventilator 100 are preferably comprised of plastics, it is possible, however, for other materials to be employed for the fabrication of these two parts of the filtering ventilator 100. By preference, such plastics are employed which are springably elastic in order to bring about the springable elastic effect of the wing corners 151 through 154 or of their wing-like clamping sections 155, 155'. However, the possibility also exists of fabricating the basic housing 10 solely of plastics of this type since, on the basic housing 10, the rapid fastening devices 50 are disposed and constructed. What is essential is that the wing-like clamping sections 155, 155' are springably elastic and that they, when being moved out of their normal position, they automatically spring back into their normal position.

The installation of the filtering ventilator 100 into the wall 80 of a switch cabinet or the like not depicted in the drawing is carried out as detailed in the following.

The wall 80, on which the filtering ventilator is to be affixed, is provided with a cutout 81 corresponding to the cross-sectional configuration of the filtering ventilator (FIG. 14). The dimensions of this cutout 80 correspond to the external dimensions of the frame 11 of the basic housing 10. The basic housing 10 is introduced with its frame 11 into this cutout 81 so that the frame 11 is passed with one 81 in the rough the cutout 81 in the mounting wall 80. The insertion of the frame 11 of the basic housing 10 into the cutout 81 of the mounting wall 80 is effected in the direction of the arrow X. Since the wing-like clamping sections 155, 155' of the rapid fastening device 50 on the housing 10 are constructed and disposed in such a way that sliding surfaces are produced, the frame 11 can be effortlessly introduced into the cutout 81 while, at the same time, the wing-like clamping sections 155, 155' are pressed in the direction of the arrow X1 into the plane of the side walls 12 through 15 of the frame 11. The dimensions of the cutout 81 in the mounting wall 80 are such that, in the depressed state, the wing-like clamping sections 155, 155' of the four wing corners 151 through 154 are urged into the plane constituted by the side walls 12 through 15 of the frame 11 so as to enable one to pass through the frame 11 on the rims delimiting the cutout 81.

When the frame 11 of the basic housing 10 with its bearing edge 19 comes to rest against the outer wall area 80a of the mounting wall 80, then the wing-like clamping sections 155, 155' have reached a position in which they, from the depressed position, spring back into their starting position, which takes place in the direction of the arrow X2 so that the wing-like clamping sections 155, 155' subsequently assume the position reproduced in the FIG. 14, in which a locking of the basic housing 10 on the mounting wall 80 takes place. The fan support 70 is, prior to the insertion of the basic housing 10 into the cutout 81 of the mounting wall 80, already mounted on the basic housing 10, in which case the dimensions of the fan support 70 with the fan 71 exceed the dimensions of the frame 11 of the basic housing 10 so that a perfect passage of the fan support 70 through the cutout 81 in the mounting wall 80 during the mounting of the basic housing 10 is ensured.

After the locking of the basic housing 10 on the mounting wall 80 with the aid of the wing-like clamping sections 155, 155' a recentering may additionally be carried out if this were to prove necessary. Hereupon the covering housing 30 with inserted filter mat 60 is mounted so that the frame 31 of the covering housing 30 is introduced into the interior of the frame 10. The clamping connection 20, 40 then enters into operation, whereby the covering housing 30 is retained on the basic housing 10. The covering housing 30 is then supported with its bearing edge 39 on the outer wall area 80a of the mounting wall 80.

Even if the mounting wall 80 were to possess different material thicknesses, a secure attachment of the filtering ventilator 100 on the mounting wall 80 is possible. If the mounting wall 80 possesses a greater material thickness, in that case the wing-like clamping sections 155, 155' on the corner areas of the housing 10 will not spring back into their starting position when this is predetermined by a smaller material thickness of the mounting wall 80. The clamping sections 155, 155' will in such a case spring back only that far until the same come to rest on the mounting wall 80. By virtue of the forces provided by the springing back capability, the filtering ventilator 100 is retained on the mounting wall 80.

What is claimed is:

1. A filtering ventilator for installation into a cutout within a mounting wall, capable of providing protection against electromagnetic and electrostatic interference, said filtering ventilator comprising:

a fan motor;

an insert formed from an electrically conductive material, having a frame possessing a latticed bottom and which is electrically connected to the mounting wall;

a basic housing formed from an electrically non-conductive material, having a latticed bottom to which the fan motor is mounted and a circumference on which there is a plurality of screwless rapid fastening devices for securing the basic housing to the mounting wall;

a filter mat inserted into the basic housing; and a covering housing mounted onto the basic housing and covering the filter mat, wherein the insert formed from electrically conductive material is a frame-like casing having outwardly angled side wall sections supported upon a circumferential rim projecting laterally relative to the basic housing of the covering housing and forming a continuous circumferential surface area.

2. A filtering ventilator according to claim 1, wherein the insert formed from electrically conductive material is comprised of a frame-like casing having outwardly angled side wall sections supported upon a circumferential rim projecting laterally relative to the basic housing of the covering housing and forming a continuous circumferential surface area;

the rapid fastening devices are constructed on the basic housing in selected areas of the basic housing;

the outwardly angled side wall sections are recessed in in the area of the rapid fastening devices: and an EMV sealing tape of an electrically conductive material is fitted on the outwardly angled side wall sections which do not possess recesses, such that a plurality of pieces of sealing tape are used and each piece overlaps another where the outwardly angled side wall sections are recessed so that a continuous circumferential electrically conducting surface is produced.

3. A filtering ventilator according to claim 2, wherein
the EMV sealing tape is bonded onto the outwardly angled side wall sections of the insert formed from an electrically conductive material and onto the areas of a circumferential rim of the covering housing located within the area of the rapid fastening devices.

4. A filtering ventilator according to claim 2, wherein
the EMV sealing tape is comprised of
a metal strip with a plurality of indentations proceeding parallelly and equidistantly spaced apart from each other, which extend across half the width of the metal strip;
a plurality of tongue-shaped sections formed between two indentations, with each tongue-shaped section being angled away from the plane of the metal strip and possessing a downwardly angled section with a base proceeding diagonally to the surface area of each tongue-shaped section; and
the indentation-free section of the metal strip has a self-adhesive coating which is located on the side of the angled sections of the tongue-shaped sections and which, in the non-used state, is covered with a peelable protective sheet.

5. An outlet filter for installation into a cutout within a mounting wall, capable of providing protection against electromagnetic and electrostatic interference, said outlet filter comprising:
an insert formed from an electrically conductive material, having a frame possessing a latticed bottom and which is electrically connected to the mounting wall;
a basic housing formed from an electrically non-conductive material, having a latticed bottom and a circumference on which there is a plurality of screwless rapid fastening devices for securing the basic housing to the mounting wall;
a filter mat inserted into the basic housing; and
a covering housing mounted onto the basic housing and covering the filter mat, wherein the insert formed from electrically conductive material is a frame-like casing having outwardly angled side wall sections supported upon a circumferential rim projecting laterally relative to the basic housing of the covering housing and forming a continuous circumferential surface area.

6. An outlet filter according to claim 5, wherein
the insert formed from electrically conductive material is comprised of a frame-like casing having outwardly angled side wall sections supported upon a circumferential rim projecting laterally relative to the basic housing of the covering housing and forming a continuous circumferential surface area;
the rapid fastening devices are constructed on the basic housing in selected areas of the basic housing;
the outwardly angled side wall sections are recessed in in the area of the rapid fastening devices; and
an EMV sealing tape of an electrically conductive material is fitted on the outwardly angled side wall sections which do not possess recesses, such that a plurality of pieces of sealing tape are used and each piece overlaps another where the outwardly angled side wall sections are recessed so that a continuous circumferential electrically conducting surface is produced.

7. An outlet filter according to claim 6, wherein
the EMV sealing tape is bonded onto the outwardly angled side wall sections of the insert formed from an electrically conductive material and onto the areas of a circumferential rim of the covering housing located within the area of the rapid fastening device.

8. An outlet filter according to claim 6, wherein
the EMV sealing tape is comprised of
a metal strip with a plurality of indentations proceeding parallelly and equidistantly spaced apart from each other, which extend across half the width of the metal strip;
a plurality of tongue-shaped sections formed between two indentations, with each tongue-shaped section being angled away from the plane of the metal strip and possesses a downwardly angled section with a base proceeding diagonally to the surface area of each tongue-shaped section; and
the indentation-free section of the metal strip has a self-adhesive coating which is located on the side of the angled sections of the tongue-shaped sections and which, in the non-used state, is covered with a peelable protective sheet.

* * * * *